United States Patent
Kilian et al.

(10) Patent No.: US 6,870,392 B2
(45) Date of Patent: Mar. 22, 2005

(54) METHOD FOR GENERATING TEST SIGNALS FOR AN INTEGRATED CIRCUIT AND TEST LOGIC UNIT

(75) Inventors: Volker Kilian, München (DE); Richard Roth, Unterhaching (DE)

(73) Assignee: Infineon Technologies AG, Munich (DE)

( * ) Notice: Subject to any disclaimer, the term of this patent is extended or adjusted under 35 U.S.C. 154(b) by 49 days.

(21) Appl. No.: 10/368,330

(22) Filed: Feb. 18, 2003

(65) Prior Publication Data

US 2003/0159098 A1 Aug. 21, 2003

(30) Foreign Application Priority Data

Feb. 15, 2002 (DE) .......................... 102 06 249

(51) Int. Cl.[7] .......................................... H03K 19/173
(52) U.S. Cl. .......................................... 326/38; 326/30
(58) Field of Search ................ 326/38, 30; 714/724, 714/712; 365/189.04, 189.12

(56) References Cited

U.S. PATENT DOCUMENTS

| | | | | |
|---|---|---|---|---|
| 5,390,192 A | | 2/1995 | Fujieda | .......................... 371/27 |
| 5,517,455 A | * | 5/1996 | McClure et al. | ............... 326/38 |
| 6,032,282 A | * | 2/2000 | Masuda et al. | ............. 714/738 |
| 6,058,057 A | * | 5/2000 | Ochiai et al. | ................ 365/201 |
| 6,605,956 B2 | * | 8/2003 | Farnworth et al. | ............. 326/38 |

OTHER PUBLICATIONS

Kawagoe, T. et al.: "A Built–In Self–Repair Analyzer (CRESTA) for Embedded DRAMs", ITC International Test Conference, IEEE, Paper 21.3, 2000, pp. 567–574.

* cited by examiner

Primary Examiner—Michael Tokar
Assistant Examiner—Lam T. Mai
(74) Attorney, Agent, or Firm—Laurence A. Greenberg; Werner H. Stemer; Gregory L. Mayback

(57) ABSTRACT

To generate test signals by a test logic unit on a semiconductor wafer, the test signals being used to check specific functions and/or parameters of an integrated circuit on the semiconductor wafer, at least two test signals are provided substantially simultaneously by the test logic unit and are subsequently serialized to generate a multiplexed test signal sequence with a data rate required for testing.

31 Claims, 2 Drawing Sheets

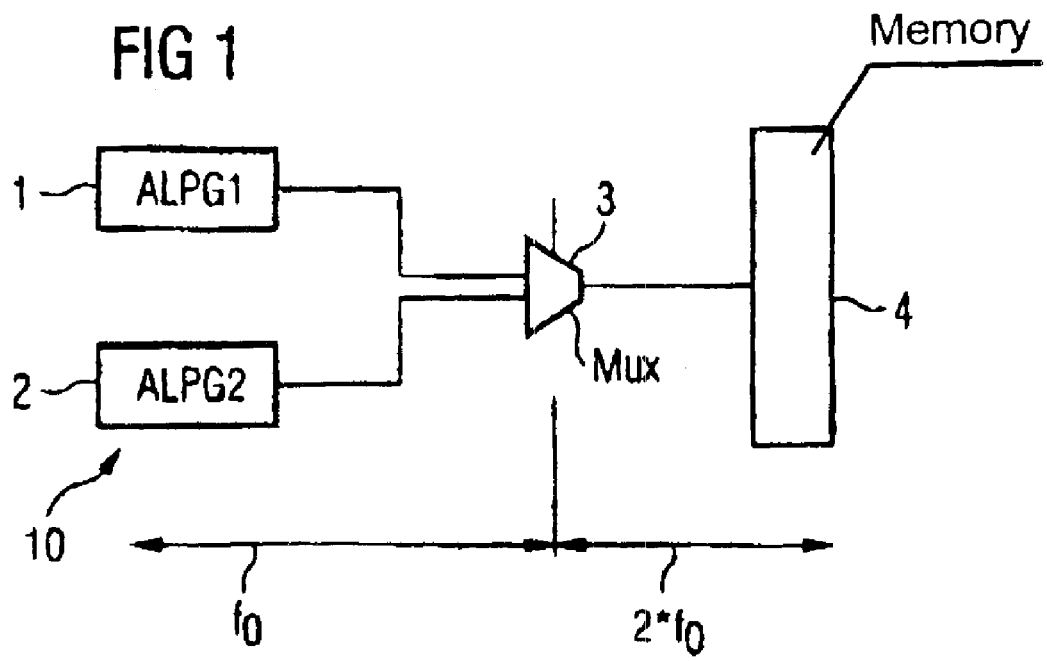
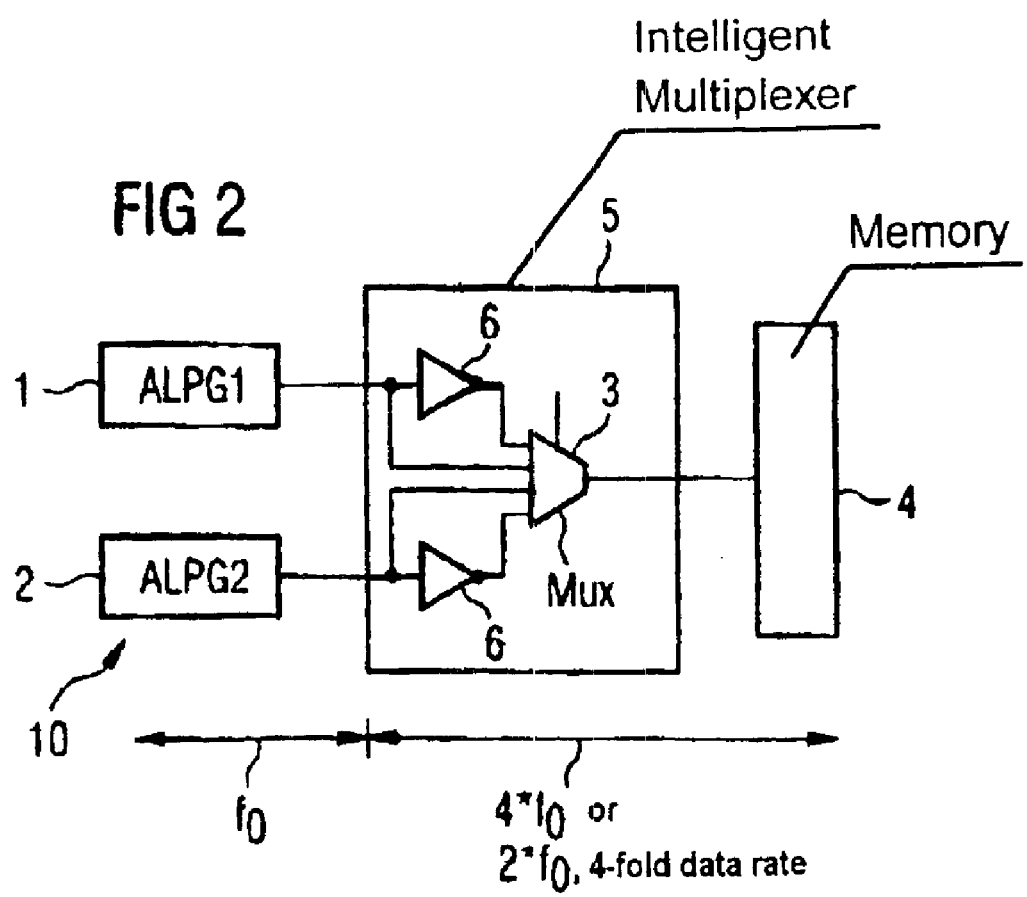

| Address [2:0] | A2 | A1 | A0 |
|---|---|---|---|
| Cycle 0: | 0 | 0 | 0 |
| Cycle 1: | 0 | 0 | 1 |
| Cycle 2: | 0 | 1 | 0 |
| Cycle 3: | 0 | 1 | 1 |
| Cycle 4: | 1 | 0 | 0 |

| | Counter | | |
|---|---|---|---|
| | A2 | A1 | A0 |
| Cycle 0: | 2 | 1 | 0 |
| Cycle 1: | 2 | 1' | 0' |
| Cycle 2: | 2 | 1 | 0 |
| Cycle 3: | 2 | 1' | 0' |
| Cycle 4: | 2 | 1 | 0 |

METHOD FOR GENERATING TEST SIGNALS FOR AN INTEGRATED CIRCUIT AND TEST LOGIC UNIT

BACKGROUND OF THE INVENTION

Field of the Invention

The invention relates to a method for generating test signals for an integrated circuit, and to a test logic unit for such an integrated circuit in order to check specific parameters and functions of the integrated circuit.

It is known for a test logic unit for complex integrated circuits (ICs) such as memory circuits, for example, Dynamic Random Access Memories to be integrated directly on the semiconductor wafer with the integrated circuit, in particular, in the sawing frame region (kerf) between two semiconductor chips. The test logic unit is used to generate test patterns in the form of addresses and/or data to carry out the test cycles in the integrated circuit for the parameter and function test.

In the case of such built-in self tests, use is frequently made of an algorithmic function generator, a so-called algorithmic pattern generator (ALPG), which generally has a system of programmed counters that can use a prescribed algorithm to generate test signals for addresses and/or data.

In the case of the prior art test logic units for integrated circuits there is, in particular, the problem that specific test signals must be generated with a rate that corresponds at least to the maximum data transmission rate of the integrated circuit to be tested, in order to be able to carry out a realistic parameter or function test. In the case of complex test logic units with a multiplicity of programmed counters, however, because of the signal propagation times in the test logic unit, the test signal rate required for testing the integrated circuit can often be achieved only with difficulty or not at all. To reach higher test signal rates, the design of the test logic unit is, therefore, increasingly being optimized to the effect of shortening the signal propagation times in the test logic unit. However, this sets physical limits to the optimization.

SUMMARY OF THE INVENTION

It is accordingly an object of the invention to provide a method for generating test signals for an integrated circuit, and a test logic unit that overcome the hereinafore-mentioned disadvantages of the heretofore-known devices and methods of this general type and that is disposed on the semiconductor wafer with the integrated circuit, both of which aiding in the production of high test signal rates in a simple way.

With the foregoing and other objects in view, there is provided, in accordance with the invention, a method for generating test signals with a test logic unit on a semiconductor chip to check at least one of specific functions and parameters of an integrated circuit on the semiconductor chip with the test signals, including the steps of providing at least two test signals substantially simultaneously with the test logic unit and subsequently serializing the at least two test signals to generate a multiplexed test signal sequence with a data rate required for testing.

With the objects of the invention in view, there is also provided a method for checking at least one of specific functions and parameters of an integrated circuit on a semiconductor chip with test signals, including the steps of generating at least two test signals with a test logic unit on the semiconductor chip, providing the at least two test signals substantially simultaneously with the test logic unit and subsequently serializing the at least two test signals to generate a multiplexed test signal sequence with a data rate required for testing, and checking the at least one of specific functions and parameters of the integrated circuit with the at least two test signals.

With the objects of the invention in view, there is also provided a method for generating test signals with a test logic unit on a semiconductor chip to check at least one of specific functions and parameters of an integrated circuit with the test signals, including the steps of providing an integrated circuit on the semiconductor chip, providing at least two test signals substantially simultaneously with the test logic unit, and subsequently serializing the at least two test signals to generate a multiplexed test signal sequence with a data rate required for testing.

In accordance with the invention, test signals are generated by a test logic unit on the semiconductor wafer to use the test signals to test specific functions and/or parameters of an integrated circuit on the semiconductor wafer, at least two test signals being provided substantially simultaneously by the test logic unit and subsequently serialized by a multiplexer to generate a multiplexed data sequence with a data rate required for testing the integrated circuit. The parallel provision of the two test signals is performed in such a case through two parallel-connected algorithmic function generators that in each case apply their generated test signals to an input of a multiplexer.

It is possible by the invention to increase the test signal generation rate in a simple way because, due to the multiplexing operation, it is possible for test signal sequences with a low data rate to be combined to form a test signal sequence with a substantially higher data rate. It is also particularly advantageous in this case that, to generate the parallel input test signals, it is possible to use algorithmic function generators that are identical in substantial parts and, therefore, all have substantially the same layout, a characteristic that substantially simplifies the outlay on production.

The test signals are, preferably, combined with the aid of a fast multiplexer that substantially has a row of switching transistors, with which individual input signals can be connected or disconnected in a simple manner. It is possible by sequentially switching over the multiplexer to convert the input test signals generated in parallel into serial test signals that can have very high data rates in accordance with the switchover rate of the multiplexer.

It is considered as a particularly advantageous solution that, in the case of a built-in self test, a plurality of test signal sequences with a relatively low data rate, which are generated substantially simultaneously, are combined to form a few test signals with a correspondingly high data rate. The data rate can be raised very easily with the aid of such a method.

In accordance with another mode of the invention, two test signal sequences generated substantially simultaneously are multiplexed with one data rate to form a test signal sequence with a doubled data rate.

In accordance with a further mode of the invention, two test signal sequences are substantially simultaneously generated and the two test signal sequences are multiplexed with one data rate to form a test signal sequence with a doubled data rate.

In accordance with an added mode of the invention, the two test signal sequences are substantially simultaneously generated from the at least two test signals and the two test signal sequences are multiplexed with one data rate to form a test signal sequence with a doubled data rate.

In accordance with an additional mode of the invention, there is provided the step of serializing the two test signal sequences generated by the test logic unit taking account of a data rate of the two test signal sequences.

In accordance with yet another mode of the invention, there is provided the step of multiplexing only test signal sequences with a relatively higher data rate.

In accordance with yet a further mode of the invention, there are provided the steps of serializing the two test signal sequences generated by the test logic unit dependent upon a data rate of the two test signal sequences and only multiplexing a test signal sequence of the two test signal sequences having a relatively higher data rate than another test signal sequence.

With the objects of the invention in view, there is also provided a test logic unit for generating test signals on a semiconductor chip used to check at least one of specific functions and parameters of an integrated circuit on the semiconductor chip, including a multiplexer, at least two algorithmic function generators connected in parallel and connected to the multiplexer, the at least two algorithmic function generators generating test signals including at least two substantially simultaneously generated test signals, and the multiplexer serializing the at least two test signals and outputting a multiplexed test signal sequence with a given testing data rate.

With the objects of the invention in view, there is also provided a test logic unit for generating test signals on a semiconductor chip used to check at least one of specific functions and parameters of an integrated circuit on the semiconductor chip, including a multiplexer, at least two algorithmic function generators connected in parallel, each of the at least two algorithmic function generators being connected to the multiplexer and generating test signals including at least two substantially simultaneously generated test signals, and the multiplexer serializing the at least two test signals and outputting a multiplexed test signal sequence with a given testing data rate.

If, for example, two algorithmic function generators are integrated in the test logic unit and connected to a dual multiplexer, it is, then, already possible to double the data rate given an appropriately configured interconnection. Such a procedure constitutes a very simple solution that can already be sufficient in many instances.

However, if further increases in the rate of generation of test signals are required, this can advantageously be achieved by configuring the multiplexer with an algorithmic operation. For example, two inverters can be connected upstream of the multiplexer such that the two test signals generated by the algorithmic function generators can be mirrored, and, then, four test signals reach the multiplexer. The data rate is doubled again thereby such that it is raised overall virtually by a factor of four.

A favorable solution is also to be seen in that the algorithmic function generators use counters to generate the individual bits. Arbitrary data and addresses can be generated easily with the aid of counters because they are easy to control.

In accordance with yet an added feature of the invention, the at least two test signals travel to the multiplexer in a signal flow direction and two inverters are connected upstream of the multiplexer with respect to the signal flow direction, the two inverters carrying out an algorithmic operation of the test signals generated by the at least two algorithmic function generators.

In accordance with yet an additional feature of the invention, there are provided two inverters are between the at least two algorithmic function generators and the multiplexer, the two inverters carrying out an algorithmic operation of the test signals generated by the at least two algorithmic function generators.

In accordance with again another feature of the invention, each of the at least two algorithmic function generators have a plurality of counters for generating individual bit signal sequences and a number of the counters in a respective one of the at least two algorithmic function generators and the parallel connection of the at least two algorithmic function generators through the multiplexer being executed in accordance with test stimuli to be generated.

In accordance with a concomitant feature of the invention, each of the at least two algorithmic function generators have a plurality of counters for generating individual bit signal sequences and a number of the counters in a respective one of the at least two algorithmic function generators and the parallel connection of the at least two algorithmic function generators through the multiplexer being dependent upon a given test stimuli to be generated.

A particular advantage is also to be seen in that the test signals are fed to the multiplexer taking account of their data rate. Thus, in particular, signals with a higher data rate can be multiplexed, while those with a lower data rate need not be fed to the multiplexer. In particular, it is possible in such a case by an appropriately intelligent concept to save on counters or else on algorithmic function generators because not all counters require an equally high generation rate.

It is also regarded as particularly advantageous that the number of the counters is adapted to the test stimuli to be generated. There is, therefore, no need for an algorithmic function generator to be completely duplicated. Rather, it suffices to multiply only as many counters as are required from the point of view of the data rate because the generation of higher bits can proceed much more slowly. The outlay is, thereby, reduced very substantially.

Other features that are considered as characteristic for the invention are set forth in the appended claims.

Although the invention is illustrated and described herein as embodied in a method for generating test signals for an integrated circuit, and a test logic unit, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 1 is a block and schematic circuit diagram of a first embodiment of the invention;

FIG. 2 is a block and schematic circuit diagram of a second embodiment according to the invention with an "intelligent" multiplexer;

DESCRIPTION OF THE PREFERRED EMBODIMENTS

Figures 3, 4, 5:
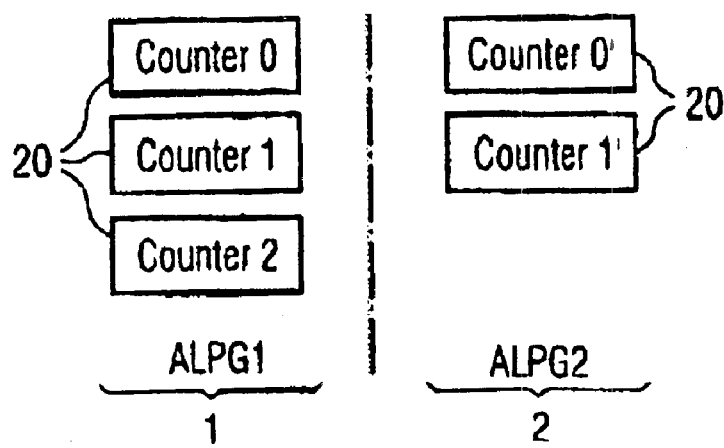
FIG. 3 is a first table with address bits according to the invention.
FIG. 4 is a second table with the participating counters for FIG. 3.
FIG. 5 is a diagrammatic configuration of two algorithmic function generators according to the invention.

In order to understand the invention better, the first step is to explain somewhat more generally how the test signals are generated for the test stimuli. The test logic unit is known per se. It is disposed at suitable locations on the semiconductor wafer with the integrated circuit, for example, a dynamic memory such as a Dynamic Random Access Memory (DRAM). It can also be provided in an alternative design, for example, to disposed the test logic unit on the wafer in the sawing frame region (kerf) between two semiconductor chips.

When a memory chip is being tested, it is necessary to generate test signals, for example, addresses or data, with the aid of which the individual memory cells are tested at least with the data rate or clock frequency permissible for the memory chip. Such a method is also referred to as a built-in self test (BIST). For example, the addresses must be enumerated in the case of such a test 0, 1, 2, 3. The first address is, then, generated in the first cycle (clock pulse), the second address in the second cycle, the third address in the third cycle etc.

To generate the test signals, according to the invention the test logic unit has at least two algorithmic function generators, as will be explained in more detail later. The algorithmic function generators generally include, inter alia, counters that are, however, relatively slow and cannot reach the data rate at which a memory chip operates. The counters have, for example, different logic circuits for incrementing or decrementing. As a result, their signal propagation times are relatively long and the low generation rate, therefore, results.

To solve such a problem, reference is now made to the figures of the drawings in detail and first, particularly to FIG. 1 thereof, which shows a first embodiment of the invention with the aid of which a high test signal rate can be generated.

Illustrated in FIG. 1 is a test logic unit 10 in a simplified schematic embodiment with two algorithmic function generators (ALPG1, 2, Algorithmic Pattern Generator) 1, 2, whose outputs are led to two corresponding inputs of a, preferably, fast multiplexer 3.

The algorithmic function generators 1, 2 substantially have a system of counters with the aid of which the test signals can be generated. Algorithmic function generators 1, 2 are used, for example, in special, commercially available test systems and are, therefore, known per se. Not yet known, however, is the integration of a plurality of, preferably, substantially identical algorithmic function generators 1, 2 in a test logic unit on a semiconductor wafer in order to increase the rate of generation of test signals.

It is proposed according to the invention to multiply the algorithmic function generators 1, 2 by simply copying the layout. As is further shown later with the aid of FIG. 5, it also suffices to multiply only individual parts of the algorithmic function generator 1, for example, one or more counters 20 (FIG. 5), in order to multiply only those test signals that are used with a high data transmission rate during the test operation.

As may further be gathered from FIG. 1, the output of the multiplexer 3 is connected to a memory unit 4, to be tested, of the semiconductor chip, which is illustrated symbolically in the right hand part of FIG. 1. The memory unit 4 to be tested is, usually, also denoted as core under test.

The mode of operation of the configuration is explained in more detail below. The two algorithmic function generators 1, 2 generate the test signals substantially simultaneously with a relatively low data rate and pass their test signals to the inputs of the multiplexer 3. The multiplexer 3 has a fast switch and, therefore, switches the test signals alternately to its output. Consequently, twice as high a data rate $(2*f_0)$ arises at the output of the multiplexer 3 as at the output of the two algorithmic function generators 1, 2 that operate with a single data rate $f_0$. For reasons of clarity, only one core test signal is considered in FIG. 1, but in practice, of course, an appropriate number of core test signals are to be taken into account.

An alternative solution to the generation of a higher test signal rate is illustrated in FIG. 2, which is regarded as particularly interesting. In a way similar to FIG. 1, two algorithmic function generators 1, 2 are, likewise, connected here in the test logic unit 10 to a multiplexer 3. However, in this case, the multiplexer 3 is equipped with an algorithmic operation. The algorithmic function is simulated here by two inverters 6 that are connected upstream in each case of an input of the multiplexer 3. Consequently, in addition to two further inputs of the multiplexer 3, which receive the test signals of the two algorithmic function generators 1, 2, the test signals, that is to say, the generated addresses or data, are mirrored and, so, a total of four input signals are present in parallel at the multiplexer 3. These four parallel input signals are switched over sequentially by non-illustrated switches of the multiplexer 3 so that, now, the test signals are present serially at the output of the multiplexer 3 and can be switched to the memory unit 4 to be tested. This simple method, therefore, yields a four-fold data rate $(4*f_0)$. Such a multiplexer is illustrated in FIG. 2 as an "intelligent" multiplexer 5. With such a configuration, success is achieved in raising the frequency $f_0$ by four times the value to $4*f_0$ or to four times the data rate. The intelligent multiplexer 5, thus, runs with the desired final frequency for the test operation.

The generation of the test signals (test stimuli) is explained in more detail with the aid of FIGS. 3 to 5 using the example of the generation of addresses with the aid of algorithmic function generators (1,2). The illustrations are reduced in a very simplified way to preserve clarity. In particular, it is shown that it is often not necessary for all the bits to be switched on the signal bus with the highest possible data rate in order to change the test signals, that is to say, addresses or data. In the example, it is assumed that the last three Least Significant Bits (LSBs) are to be generated.

FIG. 3 shows an example of the addresses [2:0]. The address bits that are generated by counters 20 (FIG. 5) of the two algorithmic function generators 1, 2 (ALPG1, ALPG2) are illustrated in a first table. As may be gathered from the table, the three address bits A0, A1 and A2 are generated sequentially in cycles 0 to 4. The addresses were incremented in this case as usual. The bits 000 are generated in cycle 0. Correspondingly, the bits 1,0,0 are generated in cycle 1 (from right to left), the bits 0,1,0 in cycle 2, the bits 1,1,0 in cycle 3, and the bits 0,0,1 in cycle 4. As may further be gathered from the first table, the bit A0 is constantly switched over, while the frequency of the high-order bits A1 and A2 is lower. Their rate of generation is, therefore, correspondingly slower, and fewer counters 20 that have to be multiplexed are required for generating these bits.

The second table in FIG. 4 shows the counters 20 with which the individual bits are generated. In cycle 0, the counters 20 of the algorithmic function generator 1 (again from right to left) 0, 1, and 2 firstly generate the three bits 0,0,0 of table 1. In cycle 1, the counters 0', 1' and 2 of the two algorithmic function generators 1, 2 correspondingly participate. In cycle 2, the counters 0, 1, and 2 participate, in cycle 3 the counters 0', 1', and 2, and in cycle 4 the counters 0, 1, and 2.

As may further be gathered from the two tables of FIGS. 3 and 4, only the counter 2 generates the A2 bit, and a change also takes place only in cycle 4. This counter can, therefore, run with the lowest clock rate. The highest clock rate is required, by contrast, in the case of the A0 bit.

It is, therefore, proposed according to the invention, preferably, to multiplex only the fastest signals and to generate the slow signals normally with the aid of the counters. In the example, only the bit A0 would need to be multiplexed. The result, inter alia, is to achieve a simple adaptation of the rate of generation to the speed of the integrated circuit.

FIG. 5 shows that two algorithmic function generators 1 and 2 are required in accordance with the exemplary embodiment, the algorithmic function generator 1 (ALPGl) having three counters (0, 1, 2), and the algorithmic function generator 2 (ALPG2) having two counters (0', 1'). Thus, when multiplying the algorithmic function generators 1, 2 it is possible for a corresponding number of counters 20 to be saved, depending on the application. However, instead of counters, it is also alternatively possible to use any desired other known circuits in the algorithmic function generator to generate the test signals.

We claim:

1. A method for generating test signals with a test logic unit on a semiconductor chip to check at least one of specific functions and parameters of an integrated circuit on the semiconductor chip with the test signals, which comprises:
   providing at least two test signals substantially simultaneously with the test logic unit; and
   subsequently serializing the at least two test signals to generate a multiplexed test signal sequence with a data rate required for testing.

2. The method according to claim 1, which comprises multiplexing two test signal sequences generated substantially simultaneously with one data rate to form a test signal sequence with a doubled data rate.

3. The method according to claim 1, which comprises:
   substantially simultaneously generating two test signal sequences; and
   multiplexing the two test signal sequences with one data rate to form a test signal sequence with a doubled data rate.

4. The method according to claim 1, which comprises:
   substantially simultaneously generating two test signal sequences from the at least two test signals; and
   multiplexing the two test signal sequences with one data rate to form a test signal sequence with a doubled data rate.

5. The method according to claim 2, which comprises serializing the two test signal sequences generated by the test logic unit taking account of a data rate of the two test signal sequences.

6. The method according to claim 5, which comprises multiplexing only test signal sequences with a relatively higher data rate.

7. The method according to claim 2, which comprises:
   serializing the two test signal sequences generated by the test logic unit dependent upon a data rate of the two test signal sequences; and
   only multiplexing a test signal sequence of the two test signal sequences having a relatively higher data rate than another test signal sequence.

8. A method for checking at least one of specific functions and parameters of an integrated circuit on a semiconductor chip with test signals, which comprises:
   generating at least two test signals with a test logic unit on the semiconductor chip;
   providing the at least two test signals substantially simultaneously with the test logic unit and subsequently serializing the at least two test signals to generate a multiplexed test signal sequence with a data rate required for tenting; and
   checking the at least one of specific functions and parameters of the integrated circuit with the at least two test signals.

9. The method according to claim 8, which comprises multiplexing two test signal sequences generated substantially simultaneously with one data rate to form a rest signal sequence with a doubled data rate.

10. The method according to claim 8, which further comprises:
    substantially simultaneously generating two test signal sequences; and
    multiplexing the two test signal sequences with one data rate to form a test signal sequence with a doubled data rate.

11. The method according to claim 8, which comprises:
    substantially simultaneously generating two test signal sequences from the at least two test signals; and
    multiplexing the two test signal sequences with one data rate to form a test signal sequence with a doubled data rate.

12. The method according to claim 9, which comprises serializing the two test signal sequences generated by the test logic unit taking account of a data rate of the two test signal sequences.

13. The method according to claim 12, which comprises multiplexing only test signal sequences with a relatively higher data rate.

14. The method according to claim 9, which comprises:
    serializing the two test signal sequences generated by the test logic unit dependent upon a data rate of the two test signal sequences; and
    only multiplexing a test signal sequence of the two test signal sequences having a relatively higher data rate than another test signal sequence.

15. A method for generating test signals with a test logic unit on a semiconductor chip to check at least one of specific functions and parameters of an integrated circuit with the test signals, which comprises:
    providing an integrated circuit on the semiconductor chip;
    providing at least two test signals substantially simultaneously with the test logic unit; and
    subsequently serializing the at least two test signals to generate a multiplexed test signal sequence with a data rate required for testing.

16. The method according to claim 15, which further comprises multiplexing two test signal sequences generated substantially simultaneously with one data rate to form a test signal sequence with a doubled data rate.

17. The method according to claim 15, which comprises;
    substantially simultaneously generating two test signal sequences; and
    multiplexing the two test signal sequences with one data rate to form a test signal sequence with a doubled data rate.

18. The method according to claim 15, which comprises:
substantially simultaneously generating two test signal sequences from the at least two test signals; and
multiplexing the two test signal sequences with one data rate to form a test signal sequence with a doubled data rate.

19. The method according to claim 16, which comprises serializing the two test signal sequences generated by the test logic unit taking account of a data rate of the two test signal sequences.

20. The method according to claim 19, which comprises multiplexing only test signal sequences with a relatively higher data rate.

21. The method according to claim 16, which comprises;
serializing the two test signal sequences generated by the test logic unit dependent upon a data rate of the two test signal sequences and only multiplexing a test signal sequence of the two test signal sequences having a relatively higher data rate than another test signal sequence.

22. A test logic unit for generating test signals on a semiconductor chip used to check at least one of specific functions and parameters of an integrated circuit on the semiconductor chip, comprising:
a multiplexer;
at least two algorithmic function generators connected in parallel and connected to said multiplexer, said at least two algorithmic function generators generating test signals including at least two substantially simultaneously generated test signals; and
said multiplexer serializing said at least two test signals and outputting a multiplexed test signal sequence with a given testing data rate.

23. The test logic unit according to claim 22, wherein:
said at least two test signals travel to said multiplexer in a signal flow direction; and
two inverters are connected upstream of said multiplexer with respect to said signal flow direction, said two inverters carrying out an algorithmic operation of said test signals generated by said at least two algorithmic function generators.

24. The text logic unit according to claim 22, including two inverters are between said at least two algorithmic function generators and said multiplexer, said two inverters carrying out an algorithmic operation of said test signals generated by said at least two algorithmic function generators.

25. The test logic unit according to claim 22, wherein:
each of said at least two algorithmic function generators have a plurality of counters for generating individual bit signal sequences; and
a number of said counters in a respective one of said at least two algorithmic function generators and said parallel connection of said at least two algorithmic function generators through said multiplexer being executed in accordance with test stimuli to be generated.

26. The test logic unit according to claim 22, wherein:
each of said at least two algorithmic function generators have a plurality of counters for generating individual bit signal sequences; and
a number of said counters in a respective one of said at least two algorithmic function generators and said parallel connection of said at least two algorithmic function generators through said multiplexer being dependent upon a given test stimuli to be generated.

27. A test logic unit for generating test signals on a semiconductor chip used to check at least one of specific functions and parameters of an integrated circuit on the semiconductor chip, comprising:
a multiplexer;
at least two algorithmic function generators connected in parallel, each of said at least two algorithmic function generators being connected to said multiplexer and generating test signals including at least two substantially simultaneously generated test signals; and
said multiplexer serializing said at least two test signals and outputting a multiplexed test signal sequence with a given testing data rate.

28. The test logic unit according to claim 27, wherein:
said at least two test signals travel to said multiplexer in a signal flow direction; and
two inverters are connected upstream of said multiplexer with respect to said signal flow direction, said two inverters carrying out an algorithmic operation of said test signals generated by said at least two algorithmic function generators.

29. The test logic unit according to claim 27, including two inverters are between said at least two algorithmic function generators and said multiplexer, said two inverters carrying out an algorithmic operation of said test signals generated by said at least two algorithmic function generators.

30. The test logic unit according to claim 27, wherein:
each of said at least two algorithmic function generators have a plurality of counters for generating individual bit signal sequences; and
a number of said counters in a respective one of said at least two algorithmic function generators and said parallel connection of said at least two algorithmic function generators through said multiplexer being executed in accordance with test stimuli to be generated.

31. The test logic unit according to claim 27, wherein;
each of said at least two algorithmic function generators have a plurality of counters for generating individual bit signal sequences; and
a number of said counters in a respective one of said at least two algorithmic function generators and said parallel connection of at least two algorithmic function generators through said multiplexer being dependent upon a given test stimuli to be generated.

* * * * *